United States Patent
Davidson

(10) Patent No.: US 6,946,363 B2
(45) Date of Patent: Sep. 20, 2005

(54) METHOD FOR BONDING SUBSTRATES

(75) Inventor: Howard Davidson, San Carlos, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 118 days.

(21) Appl. No.: 10/302,196

(22) Filed: Nov. 22, 2002

(65) Prior Publication Data

US 2003/0071264 A1 Apr. 17, 2003

Related U.S. Application Data

(62) Division of application No. 09/524,215, filed on Mar. 13, 2000, now abandoned.

(51) Int. Cl.$^7$ .............................................. H01L 21/46
(52) U.S. Cl. ...................................... 438/455; 438/105
(58) Field of Search ................................ 438/455, 459, 438/406, 105–110, 931, 109, 122, 125; 257/77, 706, 686, 712, 713, 717, 722; 117/89

(56) References Cited

U.S. PATENT DOCUMENTS

| | | | |
|---|---|---|---|
| 4,800,002 A | | 1/1989 | Peters |
| 5,184,211 A | * | 2/1993 | Fox |
| 5,240,749 A | | 8/1993 | Chow |
| 5,244,712 A | * | 9/1993 | Eden ......................... 428/142 |
| 5,300,810 A | | 4/1994 | Eden |
| 5,561,303 A | * | 10/1996 | Schrantz et al. ............... 257/77 |
| 5,591,034 A | * | 1/1997 | Ameen et al. ................ 439/91 |
| 5,645,937 A | * | 7/1997 | Noda et al. .................. 428/408 |
| 5,776,246 A | * | 7/1998 | Tanabe et al. ................ 118/89 |
| 5,791,045 A | | 8/1998 | Yamamoto et al. |
| 5,931,222 A | | 8/1999 | Toy et al. |
| 5,964,942 A | | 10/1999 | Tanabe et al. |
| 6,103,401 A | | 8/2000 | Okada et al. |
| 6,207,282 B1 | | 3/2001 | Deguchi et al. |
| 6,390,181 B1 | | 5/2002 | Hall et al. |
| 6,706,562 B2 | * | 3/2004 | Mahajan et al. ............ 438/125 |
| 2002/0173120 A1 | * | 11/2002 | Enquist ...................... 438/455 |

FOREIGN PATENT DOCUMENTS

| | | |
|---|---|---|
| EP | 479 205 | 4/1992 |
| EP | 0 814 509 | 12/1997 |
| JP | 58-15241 | 1/1983 |
| JP | 8-111481 | 4/1996 |
| WO | 96/13060 | 5/1996 |

OTHER PUBLICATIONS

Haisma et al., "Surface Preparation and Phenomenological Aspects of Direct Bonding," Philips Journal of Research, vol. 49, 1995, pp. 23–46.

(Continued)

*Primary Examiner*—Tuan H. Nguyen
(74) *Attorney, Agent, or Firm*—Meyertons Hood Kivlin Kowert & Goetzel, P.C.; B. Noël Kivlin

(57) ABSTRACT

A method for bonding diamond heat distribution structures to integrated circuit packages using optical contacting. In one embodiment, a heat spreader comprising diamond slab has a flat contact surface which is polished to a high degree of smoothness. An integrated circuit's package also has a flat contact surface which is polished to a high degree of smoothness. The contact surfaces of the diamond slab and the package are thoroughly cleaned and are then placed in contact with each other, establishing an optical contact bond between them. In one embodiment, the contact surfaces of the diamond and package which are to be bonded together are first polished, then a layer of an intermediate material such as silicon carbide is deposited on the polished surfaces. The silicon carbide layers on the contact surfaces are cleaned and placed in contact with each other to establish an optical contact bond. If desired, the silicon carbide layers on the contact surfaces may be activated with a substance such as hydrogen fluoride to promote bonding.

12 Claims, 4 Drawing Sheets

OTHER PUBLICATIONS

Haisma et al., "Diversity and feasibility of direct bonding: a survey of a dedicated optical technology," Applie Optics, vol. 33, No. 7, Mar. 1994, pp. 1154–1169.

Haisma et al., "Silicon–Wafer Fabrication and (Potential) Applications of Direct–Bonded Silicon," Philips Journal of Research, vol. 49, 1995, pp. 65–89.

Haisma et al., "Frameworks for Direct Bonding," Philips Journal of Research, vol. 49, pp. 11–21.

International Search Report, application No. PCT/US 01–07874, mailed Nov. 22, 2001.

Haisma et al., "Surface Preparation and Phenomenological Aspects of Direct Bonding," Philips Journal of Research, vol. 49, 1995, pp. 23–46.

Haisma et al., "Diversity and feasibility of direct bonding: a survey of a dedicated optical technology," Applied Optics, vol. 33, No. 7, Mar. 1994, pp. 1154–1169.

Haisma et al., "Silicon–Wafer Fabrication and (Potential) Applications of Direct–Bonded Silicon," Philips Journal of Research, vol. 49, 1995, pp. 65–89.

Haisma et al., "Frameworks for Direct Bonding," Philips Journal of Research, vol. 49, pp. 11–21.

International Search Report, application No. PCT/US 01–07874, mailed Nov. 22, 2001.

* cited by examiner

METHOD FOR BONDING SUBSTRATES

This application is a divisional application of U.S. patent application Ser. No. 09/524,215 filed Mar. 13, 2000, now abandoned.

BACKGROUND OF THE INVENTION

1. Field of the Invention

The invention relates generally to integrated circuits and more specifically to integrated circuits in which a diamond structure is bonded to the substrate of the integrated circuit.

2. Description of Related Art

Modern integrated circuits are becoming increasingly complex. Advances in lithography and other manufacturing technologies allow the size of transistors and other components to be reduced, which in turn allows more components to be placed on the chip. Typical integrated circuits may contain more than a million electronic components on a single chip.

As the complexity of integrated circuits grows, the power and cooling requirements of the integrated circuits also grow. Since there are a greater number of electrical components on the chips, each of which requires power to operate, the overall power required to drive the chips increases. Then, since the chips require more power, they dissipate more heat. This heat must be removed from the chips to prevent overheating which could damage the chips. Another problem which exists is the presence of temperature gradients in the chip. Depending upon the design and the execution of software in the chip, the power density may vary from point to point on the chip. These localized hot and cool spots and the resulting temperature gradients should be minimized to reduce the risk of damage to the chip.

Many integrated circuits use heat sinks or heat exchangers to efficiently remove excess heat. These heat exchangers typically consist of metal (e.g., aluminum) bodies which are connected to the package of the chip. It is important to ensure good thermal contact between the integrated circuit and the heat exchanger so that as much heat as possible is transferred from the integrated circuit to the heat exchanger. Heat exchangers may include fins or other structures which allow the energy absorbed by the heat exchanger to be transferred to the surrounding environment.

Metal heat exchangers are typically bonded to integrated circuit packages by soldering. The heat exchanger cannot simply be soldered directly to the package. The package must first be coated with a layer of a reactive metal (e.g., titanium) and then a layer of a solderable metal (e.g., copper.) The heat exchanger can then be soldered to the layer of solderable metal.

Not all heat exchangers are constructed of metal. Because diamond has very good thermal conductivity (better than metal, in fact,) it can also be used in a heat exchanger or heat spreader. Conventional methods of attaching diamond to integrated circuit packages are very similar to the methods used with metal heat exchangers. Referring to FIG. 1, a diagram illustrating the structure of an integrated circuit package having a diamond heat spreader is shown. In the case of diamond, instead of coating only the package 11 with layers of reactive 12 and solderable 13 metals, both package 11 and the diamond 14 are coated in this manner. The solderable metal layers are then bonded by a layer of solder 15.

Conventional methods of bonding diamond heat spreaders to integrated circuits present several problems. First, it is both expensive and time consuming to deposit the layers of metal on the substrate and heat spreader. Second, when the solderable layers are soldered together, there may be bubbles or voids 16 remaining in the solder layer. Since very little thermal energy is transmitted through these voids, the heat transfer path from the substrate to the heat spreader is restricted. This is illustrated by the arrows in FIG. 1. Further, the uneven distribution of thermal energy in the heat spreader cause temperature gradients which may damage the integrated circuit. Third, when the solder is applied, it and at least the surfaces of the solderable layers are at a temperature above the melting point of the solder. As the solder hardens and it and the other layers cool, they contract. Because they contract at different rates, stresses are built up between the layers, potentially causing delamination of the layers and damage to the integrated circuit and heat spreader.

SUMMARY OF THE INVENTION

One or more of the problems outlined above may be solved by one or more embodiments of the present invention which, broadly speaking, comprises a method for bonding diamond heat distribution structures to integrated circuit packages using optical contacting. In one embodiment, a diamond slab is bonded to the package of an integrated circuit chip to provide a means for spreading the heat produced by the chip. The diamond slab has a flat contact surface which is polished to a high degree of smoothness. The silicon package of the integrated circuit also has a flat contact surface which is polished to a high degree of smoothness. The contact surfaces of the diamond slab and the silicon package are thoroughly cleaned and are then placed in contact with each other. The polished contact surfaces are bonded together when they are placed in contact by their affinity for each other.

In one embodiment, the contact surfaces of the diamond and silicon which are to be bonded together are coated with a layer of an intermediate material. The intermediate material may comprise silicon carbide which is deposited on the polished surfaces. The diamond and silicon surfaces may be polished before the layer of silicon carbide is deposited. Diamond is more difficult to polish than silicon, however, so it may be preferable to simply polish the silicon carbide layer deposited on the diamond. The silicon carbide layers on the contact surfaces are cleaned and, if desired, activated with hydrogen fluoride. Then contact surfaces are then placed in contact with each other to establish the optical contact bond.

One embodiment comprises an integrated circuit having a diamond heat distributing structure bonded thereto. The diamond structure includes a diamond slab which is coupled to the silicon substrate of the integrated circuit by an optical contact bond. The diamond slab and silicon substrate each has a complementary contact surface which is polished to a high degree of smoothness. In one embodiment, the peak-to-peak smoothness of the contact surfaces is about 0.5 microns. The contact surfaces may be flat, or they may have other complementary shapes (e.g., they may be spherical.) The contact surface of the diamond slab is held in position against the contact surface of the silicon substrate by the affinity of the contact surfaces for each other. No adhesive material is required to bond the diamond to the silicon.

In one embodiment, the contact surfaces of the diamond slab and the silicon substrate are coated with an intermediate material such as silicon carbide. The intermediate material comprises a thin layer (on the order of several hundred Angstroms) over each of the contact surfaces. The intermediate silicon carbide layers are cleaned before placing them in contact with each other. The silicon carbide layers may also be activated by treating them with hydrogen fluoride, although this is not necessary. The diamond and silicon are bonded by contact between the surfaces.

BRIEF DESCRIPTION OF THE DRAWINGS

Other objects and advantages of the invention will become apparent upon reading the following detailed description and upon reference to the accompanying drawings in which.

Figure 1:
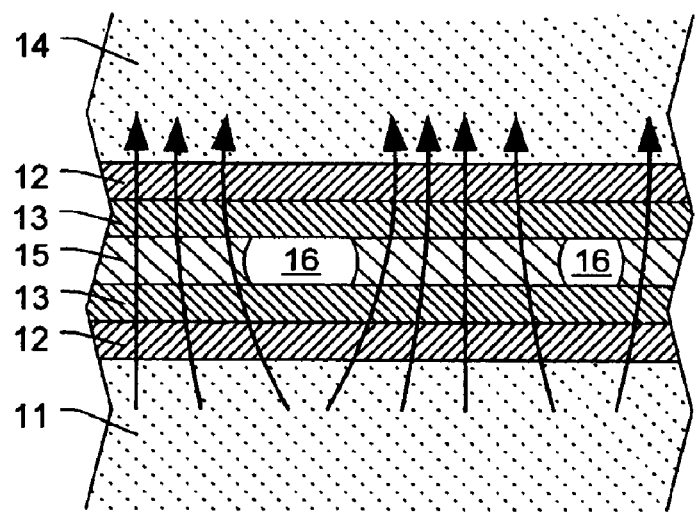
FIG. 1 is a diagram illustrating the structure of an integrated circuit having a diamond heat exchanger bonded thereto by soldering.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A preferred embodiment of the invention is described in detail below. It should be noted that many embodiments are possible and that the following embodiment is intended to be illustrative rather than limiting.

Broadly speaking, the invention comprises a system and method for bonding a diamond structure to a substrate by optically contacting the two. In one embodiment, a diamond slab is bonded to the silicon substrate of an integrated circuit chip to provide a means for distributing the heat produced by the chip. (The term "slab" is used herein to refer to a piece of diamond which has a contact surface, regardless of the shape of the particular piece.) The diamond slab is bonded to the silicon substrate by polishing a contacting surface of each to a high degree of smoothness, thoroughly cleaning the polished surfaces and then placing the polished surfaces in contact with each other. The polished surfaces are bonded together by their affinity for each other. The diamond slab and silicon substrate may also be bonded together by placing a layer of an intermediate material on one or both of the polished surfaces and then placing the polished surfaces in contact with each other.

Figure 2:
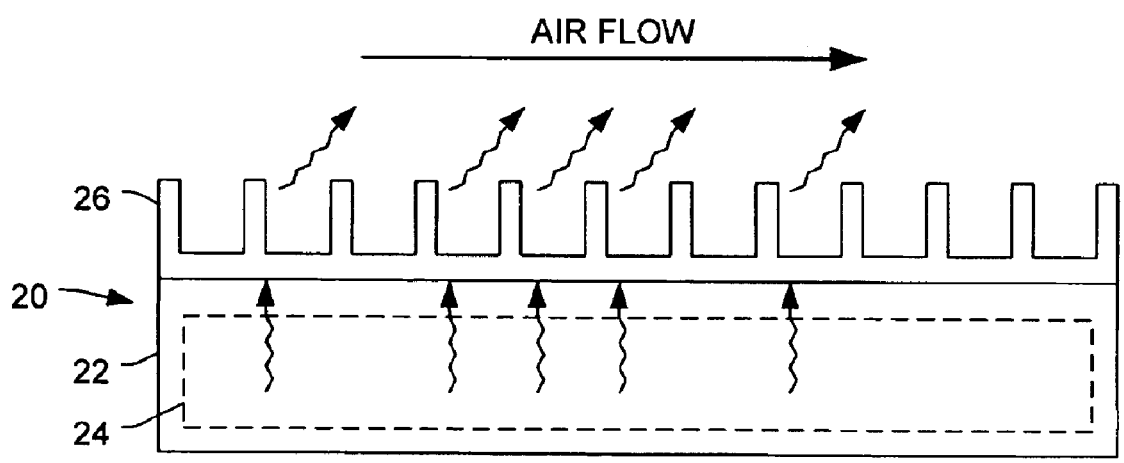
FIG. 2 is a diagram illustrating an integrated circuit chip and heat exchanger assembly in one embodiment.

Referring to FIG. 2, a diagram illustrating an integrated circuit chip and heat exchanger assembly in one embodiment is shown. integrated circuit chip 20 comprises a substrate 22 within which circuitry 24 is constructed. Heat exchanger 26 is bonded to substrate 22. Thermal energy generated by circuitry 24 diffuses through substrate 22 and into heat exchanger 26. Heat exchanger 26 then transfers this energy to the surroundings. Typically, air is circulated around heat exchanger 26 to remove the thermal energy from the immediate environment of the integrated circuit.

In one embodiment, diamond is used as the material for at least a portion of heat exchanger 26. In this case, the base of the heat exchanger comprises a diamond slab. Because diamond is a very good conductor of heat, the diamond serves to spread the heat laterally across the base of the heat exchanger, thereby reducing temperature gradients across the surface of the integrated circuit package. The diamond slab may therefore be referred to as a heat spreader. The spreading of the heat also allows the heat exchanger itself to be designed for the average power dissipation of the integrated circuit rather than the peak dissipation which might be required to prevent localized hot spots from damaging the chip. Because the diamond spreads the heat laterally, an oversized diamond slab (i.e. one which is larger than the integrated circuit surface to which it is bonded) can be used to further spread out the heat and thereby reduce the heat dissipation requirements of the heat exchanger.

Although diamond structures are conventionally bonded to integrated circuit substrates by soldering as described above, the diamond is bonded to the substrate of the integrated circuit in the present method and apparatus by "optically contacting" the diamond to the substrate. Optical contacting is a process by which complementary surfaces of two pieces of material are polished to a very high degree of smoothness and are then placed in contact with each other. The attraction between the complementary surfaces bonds the two pieces of material together. This process is referred to as optical contacting because it is commonly used to bond optical components (e.g., lenses) together. Bonding the diamond to the silicon by optical contact bonding eliminates the problems described above in connection with soldered bonds.

There are various theories to explain the physical mechanism of optical contacting. One of the more widely accepted theories is that there is a weak attractive force between atoms which are in close contact. This attractive force has alternately been described as resulting from the sharing of electrons or electromagnetic fields, or from Van der Waals forces or London dispersive forces. (Although there are other theories as to the origin of the attractive force which is active in optical contacting, the specific origin of the force is not important to the invention, so those theories will not be described herein.) The effect of the attractive force is significant only when the atoms upon which it is acting are very close, typically on the order of microns. (It should be noted that, if Van der Waals forces are the source of the contact bonding force, there is actually a point at which the atoms of the contacting surfaces can become so close that they begin to repel each other.) Because the effect of the attractive force is small when it does come into play, it is only significant on a macroscopic scale when a large number of atoms are close enough to feel its effect.

Because, generally speaking, the attractive force drops off sharply with the distance between the contacting surfaces, it is important that the surfaces be as nearly complementary as possible. In other words, their respective shapes must be nearly exact complements in order to maintain the attractive force across the surfaces. In one embodiment, the surfaces should be smooth to within approximately a micron, although the required smoothness may vary (e.g., up to the order of ten microns, or possibly more) depending upon the materials involved. Although the surfaces may have any complementary shapes, in the simplest (and probably most common) case, both surfaces are flat. If the surfaces vary from the desired complementary shapes, the distance between different parts of the surfaces will increase. For example, if one surface is flat and the other is slightly spherical, there will be one point at which the surfaces may be in contact, and the remainder of the two surfaces will become increasingly distant from each other as they move away from the point of contact.

On a macroscopic level, it may be relatively easy to produce the complementary (e.g., flat) surfaces. While the surfaces may be flat to the naked eye, however, they may not be flat on a microscopic level. The surface may, on a microscopic level, have peaks and valleys and other imperfections which deviate from a perfectly planar surface. These imperfections may appear to the naked eye as roughness or as a dull finish, depending upon the magnitude of the imperfections. It is therefore important that the surfaces be polished to reduce the roughness (i.e., the surface imperfections.) This is illustrated in FIGS. 3–6.

Figure 3:
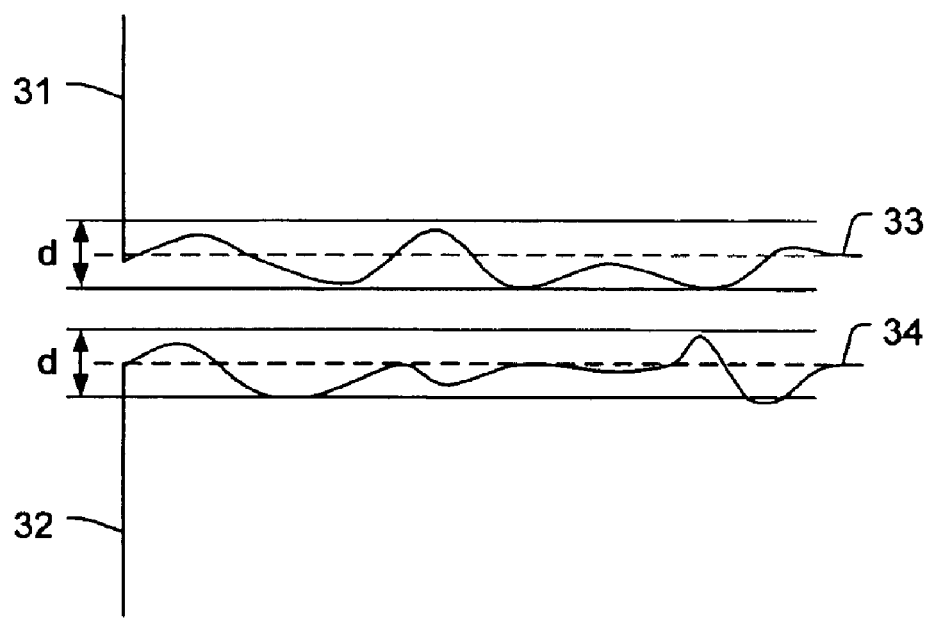
FIG. 3 is a diagram illustrating the irregularities in a pair of complementary unpolished surfaces.

Referring to FIG. 3, a diagram illustrating the irregularities in a pair of complementary surfaces is shown. To the naked eye, surfaces 31 and 32 may appear to be flat. On a microscopic level, however, it becomes apparent that each of these surfaces contains many irregularities, as shown in the figure. The smoothness (or roughness) of surfaces 31 and 32 can be defined in terms of these irregularities and the amount by which each surface varies from a plane (33 or 34, respectively) that defines the ideal shape of that surface. In FIG. 3, this variation is indicated as d. The highest point on one of the surfaces therefore varies by no more than d from the lowest point on that surface. Alternately, the surface can be defined as the ideal surface (33 or 34,) plus or minus d/2.

Figure 4:
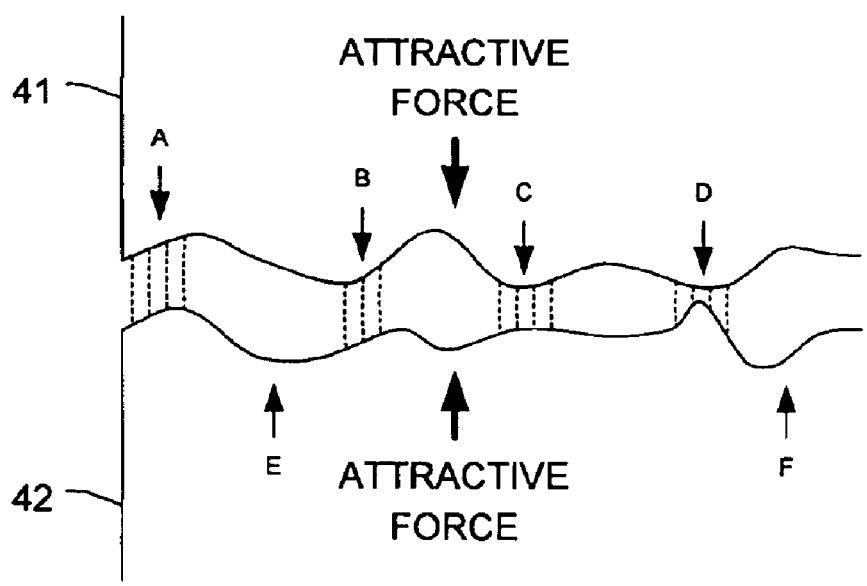
FIG. 4 is a diagram illustrating the attractive force experienced which is felt by a pair of complementary unpolished surfaces.

Referring to FIG. 4, when surfaces 41 and 42 are brought into contact, at least several points on each surface will come into contact with corresponding points on the other surface. One of these points is indicated at location D in the figure. At these points, the surfaces will feel the effect of the attractive force drawing them together (as indicated by the vertical lines between the surfaces.) When these points come into contact, the remaining points on the surfaces cannot be drawn any closer together. Over the remainder of the two surfaces, the distance between points on surface 41 and those on surface 42 will vary. At some points (indicated by A, B and C in the figure,) the distance may be small enough that the attractive force is felt, albeit less so than at the points of contact. At other points (indicated by E and F,) the distance may be large enough that the effect of the attractive force is negligible. The cumulative effect of the attractive force over the unpolished surfaces is typically so small that there is little or no noticeable attraction between the surfaces. This is indicated by the arrows labeled "attractive force." (It should be noted that these arrows are not intended to indicate that the attractive force is concentrated at the location of the arrows.)

Figure 5:
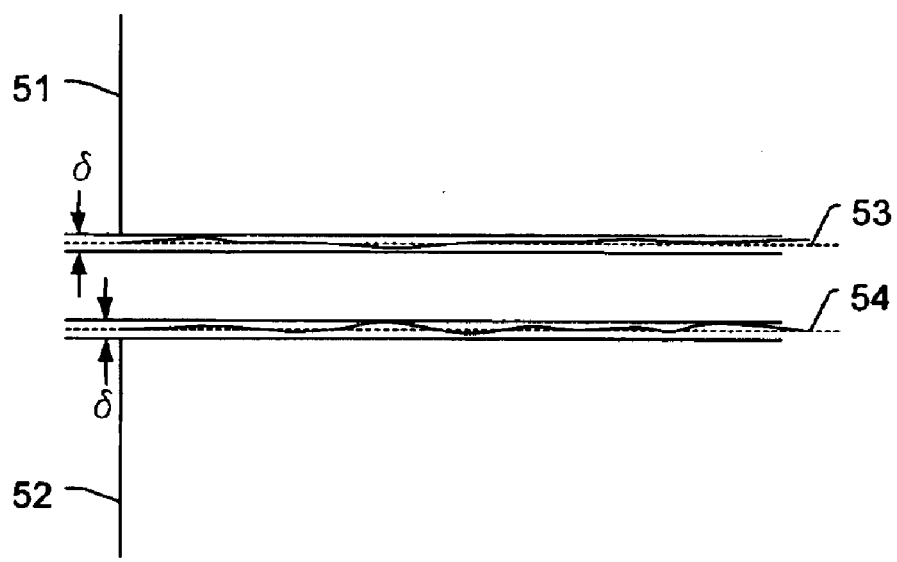
FIG. 5 is a diagram illustrating the irregularities in a pair of complementary polished surfaces.

Referring to FIG. 5, a diagram illustrating the irregularities in a pair of complementary polished surfaces 51 and 52 is shown. Again, to the naked eye, both of the surfaces would appear to be flat. On the microscopic level, irregularities again become apparent, but the irregularities are much smaller than those of the unpolished surfaces shown in FIGS. 3 and 4. In the case of the polished surfaces, the irregularities vary from the ideal planes 53 and 54 by no more than δ/2, where δ is much smaller than d (the surface variation for the unpolished surfaces.) The magnitude of δ should typically be on the order of 0.25–0.5 micron to establish a good bond. It should be noted that the frequency of the surface irregularities may affect the strength of the bond. For example, if one set of contact surfaces has higher-frequency ripples and a second set of contact surfaces has lower-frequency ripples of the same peak-to-peak magnitude, the bond between the surfaces having the lower-frequency ripples will be stronger. The bond strength will also vary with factors such as the materials which are being bonded.

Figure 6:
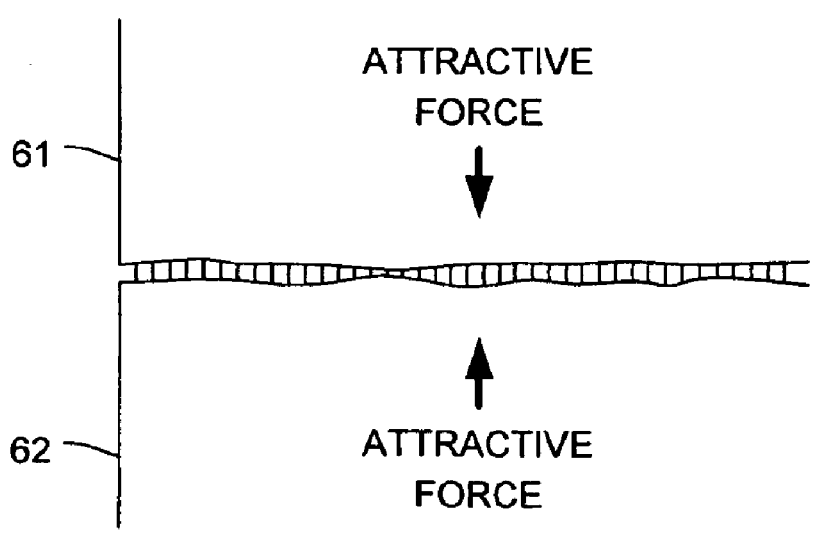
FIG. 6 is a diagram illustrating the attractive force experienced which is felt by a pair of complementary polished surfaces.

Referring to FIG. 6, the effect of the attractive force across the polished surfaces is illustrated. In this case, essentially all of the points on each of surfaces 61 and 62 are close enough that the effect of the attractive force is significant (i.e., non-negligible.) The force is illustrated by the vertical lines in the figure. Therefore, although the force may vary from one location to another, the force at each location makes a contribution to the overall force between the surfaces. The cumulative effect, which is indicated by the block arrows in the figure, is sufficient to bond the surfaces together. This bond can be so strong that, in some cases, the surfaces cannot be separated without damaging the bonded objects.

The strength of an optical contact bond depends upon a number of factors. The primary factors are the types of material being bonded, the area of the contact surfaces, and the smoothness of the contact surfaces. While dissimilar materials (e.g., silicon and diamond can be bonded through optical contacting, it is typically easier to bond similar materials. For example, two fused quartz optical flats can be easily bonded together using optical contacting. Similar materials generally form a stronger optical contact bond than dissimilar materials which have the same surface characteristics (i.e., shape and smoothness.) As explained above, the strength of the optical contact bond normally increases with the smoothness of the contact surfaces because this allows more of the surface to be in close enough proximity to feel a non-negligible attractive force. For a given contact surface area, a pair of smoother surfaces will experience a stronger attractive force. Finally, the strength of the bond increases with the area of the contact surfaces. If the bonding force per unit area is constant across the contact surface, the cumulative strength of the bond increases as the contact surface area increases (e.g., if the area doubles, the bond strength doubles.) While it is not believed that the strength of the bond is affected by moisture, some may find it desirable to seal the edges of the bonded surfaces with a sealant to prevent the introduction of moisture between the surfaces.

Figure 7:
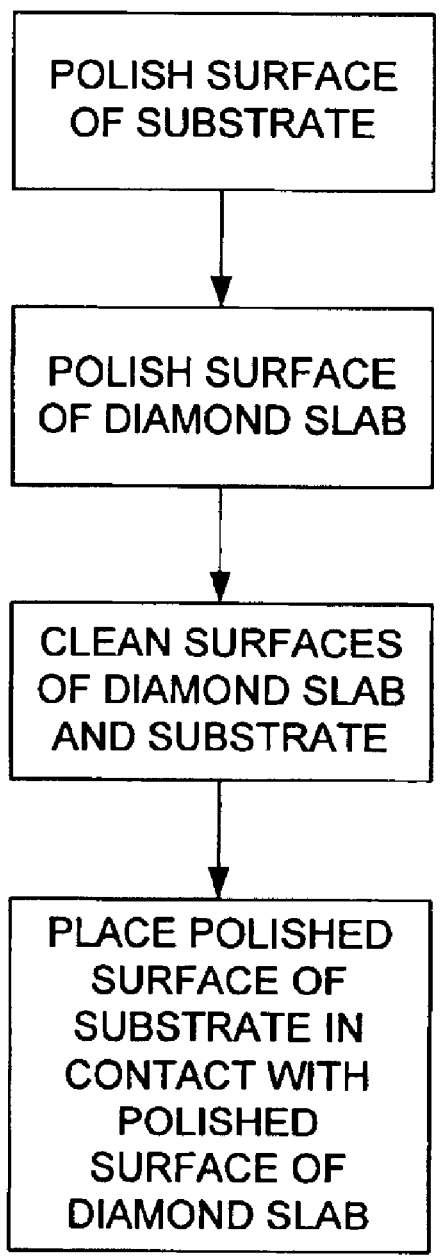
FIG. 7 is a flow diagram illustrating the process of bonding a diamond slab to a substrate in one embodiment.

In one embodiment, a diamond slab is bonded by optical contact directly to the silicon substrate of an integrated circuit chip. Referring to FIG. 7, a flow diagram illustrating the process of bonding the diamond to the substrate is shown. First, the contact surfaces of the respective materials are polished to a high degree of smoothness. In one embodiment, the surfaces are polished until they are flat to within approximately one micron. The contact surfaces are then thoroughly cleaned. Particles on the contact surfaces may be as large as (or larger than) the desired spacing between the contact surfaces. Since the strength of the optical contact bond is dependent in large part upon the spacing between the contacting surfaces, it is important that particles which may prevent the surfaces from coming close enough to each other to bond be removed from the surfaces.

Once the contact surfaces have been cleaned, the contact surface of the diamond slab and the contact surface of the silicon substrate are simply placed in contact with each other. The bond between the surfaces is established upon contact.

While the embodiment described above uses optical contacting to bond the diamond slab directly to the silicon substrate, it should be noted that it is typically easier to bond two pieces of the same material. That is, all else being equal, the bond between two pieces of the same material will generally be stronger than the bond between two different materials. For that reason, one alternate embodiment uses layers of an intermediate material to form the optical contact bond between the diamond slab and the silicon substrate.

Figure 8:
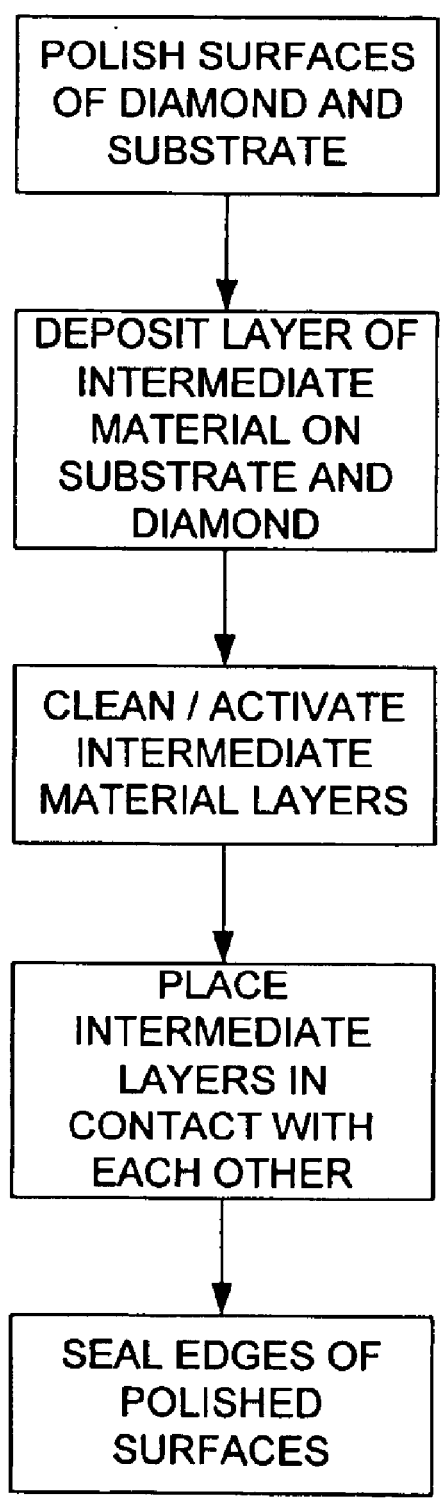
FIG. 8 is a flow diagram illustrating the process of bonding a diamond slab to a substrate using layers of intermediate material in one embodiment.

Referring to FIG. 8, a flow diagram illustrating the process of bonding a diamond slab to a silicon substrate using layers of intermediate material is shown. In this embodiment, the contact surfaces of the diamond and silicon are polished, generally in the same manner as previously described. After the contact surfaces are polished, however, a layer of amorphous hydrogenated silicon carbide is deposited on each of the contact surfaces. A suitable material is marketed by Dow Corning under the trade name Chipseal. The silicon carbide is deposited by a plasma enhanced chemical vapor deposition (PECVD) process. The layer of silicon carbide deposited on the diamond and silicon is a few hundred Angstroms (a few hundredths of a micron) thick.

In one embodiment, a diamond heat exchanger structure can be bonded to the diamond heat spreader. This can be accomplished by placing the diamond heat exchanger structure on the diamond slab and depositing additional diamond on the combined structure by a chemical vapor deposition (CVD) process. The deposited diamond bonds itself to both the diamond slab and the heat exchanger structure, effectively forming a unitary heat exchanger. The contact surface of the diamond slab can then be polished, coated with silicon carbide if necessary, and optical contact bonded to the integrated circuit package as described above.

While the present invention has been described with reference to particular embodiments, it will be understood that the embodiments are illustrative and that the invention scope is not limited to these embodiments. Many variations, modifications, additions and improvements to the embodiments described are possible. These variations, modifications, additions and improvements may fall within the scope of the invention as detailed within the following claims.

What is claimed is:

1. A method for bonding a diamond slab to a semiconductor substrate of an integrated circuit comprising:
   polishing a contact surface of the semiconductor substrate to a high degree of smoothness;
   polishing a contact surface of the diamond slab to a high degree of smoothness;
   cleaning said semiconductor substrate contact surface and said diamond contact surface; and
   placing said semiconductor substrate contact surface in direct contact with said diamond contact surface and thereby bonding the semiconductor substrate to the diamond slab.

2. The method of claim 1 wherein said semiconductor substrate comprises silicon.

3. The method of claim 1 further comprising sealing the edges of an interface formed by said contact surfaces.

4. The method of claim 1 wherein said contact surfaces are flat.

5. The method of claim 1 wherein said contact surfaces are each polished to a smoothness of about 0.5 microns peak-to-peak.

6. A method comprising:
   providing a heat distribution structure configured to transfer thermal energy from an integrated circuit substrate to air, the heat distribution structure comprising a diamond slab;
   polishing a contact surface of the integrated circuit substrate to a high degree of smoothness;
   polishing a contact surface of the diamond slab to a high degree of smoothness;
   cleaning the substrate contact surface and the diamond contact surface; and
   optically bonding the substrate with the diamond slab via the contact surfaces.

7. The method of claim 6 further comprising conducting thermal energy from the integrated circuit substrate through the optical bond to the diamond slab and from the diamond slab through the remainder of the heat distribution structure to the air.

8. The method of claim 6 further comprising depositing a layer of intermediate material on the contact surfaces prior to said optically bonding.

9. The method of claim 8 further comprising activating said intermediate material on the contact surfaces.

10. The method of claim 8 wherein the intermediate material comprises silicon carbide.

11. The method of claim 8 wherein said integrated circuit substrate comprises silicon.

12. The method of claim 6 further comprising sealing the edges of an interface formed by said contact surfaces.

* * * * *